US005728664A

United States Patent [19]

Michelotti

[11] Patent Number: 5,728,664
[45] Date of Patent: Mar. 17, 1998

[54] PHOTORESIST STRIPPING COMPOSITIONS

[75] Inventor: Francis W. Michelotti, Easton, Pa.

[73] Assignee: Ashland, Inc.

[21] Appl. No.: 631,921

[22] Filed: Apr. 15, 1996

[51] Int. Cl.$^6$ .................. C11D 3/18; C11D 3/20; C11D 1/831; C11D 1/83

[52] U.S. Cl. .................. 510/176; 510/414; 510/407; 430/331

[58] Field of Search .................. 510/176, 414, 510/407; 430/331

[56] References Cited

U.S. PATENT DOCUMENTS

| | | | |
|---|---|---|---|
| 4,070,203 | 1/1978 | Neisius et al. | 134/3 |
| 4,165,294 | 8/1979 | Vander Mey | 252/143 |
| 4,165,295 | 8/1979 | Vander Mey | 252/143 |
| 4,215,005 | 7/1980 | Vander Mey | 252/153 |
| 4,221,674 | 9/1980 | Vander Mey | 252/141 |
| 4,304,681 | 12/1981 | Martin et al. | 252/143 |
| 4,395,348 | 7/1983 | Lee | 252/143 |
| 4,426,311 | 1/1984 | Vander Mey | 252/143 |
| 4,844,832 | 7/1989 | Kobayashi et al. | 252/143 |
| 4,944,893 | 7/1990 | Tanaka et al. | 252/171 |
| 4,992,108 | 2/1991 | Ward et al. | 134/38 |
| 5,472,631 | 12/1995 | Harris | 252/171 |
| 5,650,261 | 7/1997 | Winkle | 430/270.1 |

*Primary Examiner*—Douglas J. McGinty
*Attorney, Agent, or Firm*—John Lezdey

[57] ABSTRACT

A non-aqueous negative photoresist stripping composition which consists essentially of about 40 to 80% by weight of an alkylnaphthalene solvent, about 5 to 20% by weight of an alkyl phenol which provides a corrosion inhibitory effect, about 5 to 20% by weight of a linear monoalkylbenzene sulfonic acid which is a surfactant and about 1 to 10% by weight of a dialkylbenzene sulfonic acid. There is further provided a process for removing coatings from a photoresist with the compositions of the invention.

5 Claims, No Drawings

PHOTORESIST STRIPPING COMPOSITIONS

FIELD OF THE INVENTION

This invention relates to photoresist stripping compositions. More particularly, the invention relates to a non-aqueous chlorine-free negative photoresist stripping composition containing aromatic solvents and a mixture of aromatic sulfonic acids that can be easily rinsed away with water. Moreover, the composition is provided with a corrosion inhibitor.

BACKGROUND OF THE INVENTION

During manufacture of semiconductors and semiconductor microcircuits, it is frequently necessary to coat the materials from which the semiconductors and microcircuits are manufactured with a polymeric organic substance, generally referred to as a photoresist, e.g., a substance which forms an etch resist upon exposure to light. These photoresists are used to protect selected areas of the surface of the substrate, e.g. silicon, $SiO_2$ or while such etchant selectively attacks the unprotected area of the substrate. Following completion of the etching operation and washing away of the residual etchant, it is necessary that the resist be removed from the protective surface to permit essential finishing operations.

It is necessary in a photolithographic process that the photoresist material, following pattern delineation, be evenly and completely removed from all unexposed areas, in the case of positive resists, or exposed areas in the case of negative resists, so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

A common method used in removing the photoresist from the substrate is by contacting the substract with an organic stripper. Heretofore these organic strippers have been composed of various components whose purpose it was to lift and remove the polymeric photoresist from the substrate. However, these stripping solutions have heretofore usually contained chlorinated hydrocarbon compounds which resulted in a distinct disadvantage due to the toxicity as well as pollution problems arising from their disposal.

Chlorinated hydrocarbons-free strippers are described in U.S. Pat. No. 4,070,203 (issued Jan. 24, 1978 to Neisus et al). These strippers, having only an alkylbenzenesulfonic acid component of 12–20 carbons and a chlorine-free, aromatic hydrocarbon component with a boiling point about 150° C., suffer from the disadvantage that they cannot be easily rinsed off the inorganic substrate after stripping with temperatures that are generally required for conventional stripping compositions. Moreover, such compositions are corrosive to many conventional photoresists.

It is highly desirable that stripping compositions be provided that are effective and efficient stripping compositions for removal of coatings from substrates that heretofore have resisted ready removal with conventionally available strippers.

It is also desirable that effective stripping compositions be provided that are devoid of undesirable chlorinated components and which do not require the use of hot caustic components. Highly desirable are stripping compositions and use thereof that are not considered undesirable by regulatory agencies overseeing their production and use.

U.S. Pat. No. 4,165,294 to John E. Vander Mey discloses a stripping solution free from chlorinated hydrocarbons comprising a surfactant, an alkylarylsulfonic acid and an aromatic hydrocarbon having a boiling point above 150° C. The aromatic hydrocarbons are optional and are preferably mixtures of aromatic solvents having 9–13 alkyl carbons and do not comprise more than 40 weight percent. The composition does however cause pitting in many photoresist substrates.

U.S. Pat. Nos. 4,426,311; 4,395,348; 4,304,681; 4,221,674; 4,215,005 and 4,165,295 each disclose the use of an organic sulfonic acid in a photoresist stripping composition. However, the organic sulfonic acid is utilized in combination with solvents having the aforementioned disadvantages.

U.S. Pat. No. 4,992,108 to Ward et al, which is herein incorporated by reference, discloses non-aqueous biodegradable negative photoresist stripping compositions which contain an aromatic solvent and an organic sulfonic acid. The present invention provides a specific improvement over the formulations disclosed therein. The compositions in this patent cannot be used on some conventional photoresist substrates for prolonged periods because of their corrosive effects.

It is an object of the invention to provide a non-aqueous negative photoresist stripping composition which can be used at a wide range of operating conditions and at lower temperatures without corrosion of the photoresist substrate.

It is another object of this invention to provide a photoresist stripping solution which is essentially free of naphthalene and chlorinated hydrocarbon compounds.

It is an additional object of this invention to provide such a solution which is substantially clean water rinseable such that the hydrocarbon solvent does not oil out and the polymer does not reprecipitate during rinsing.

SUMMARY OF THE INVENTION

The present invention relates to a non-aqueous negative photoresist stripping composition consisting essentially of an alkyl phenol, an alkylnaphthalene solvent, a surfactant consisting of a linear monoalkylbenzenesulfonic acid and a dialkyl sulfonic acid. More particularly, the stripping composition consists essentially of about 5–20% by weight of composition of an alkyl phenol, about 5–20% by weight of composition of a surfactant comprising a linear monalkylbenzenesulfonic acid about 1–10% by weight of composition of a dialkylbenzene sulfonic acid and about 40–80% by weight of composition of a mono-or dialkyl naphthalene wherein the alkyl group contains 1–4 carbon atoms.

The invention also relates to a method for removing a coating from a substrate utilizing the composition of the invention.

DETAILED DESCRIPTION OF THE INVENTION

The present invention provides a composition which is effective in removing negative photoresists from an inorganic substrate, has a low toxicity and could be used over a wide temperature range and at low temperatures. While organic sulfonic acid have been previously used in stripping compositions, they have been used in combination with solvents that presented problems in disposal and use.

It has been surprisingly discovered that when a surfactant linear monalkylbenzenesulfonic acid is used in combination with an alkyl phenol which acts as an inhibitor and a surfactant, such as nonyl phenol, and another sulfonic acid, namely dialkylbenzene sulfonic acid, together with a solvent essentially comprising a mono- or dialkyl naphthalene, there is provided a composition which results in a surprising improvement in removing coatings from negative photoresists, which coatings will not redeposit, is cleanly rinseable with water and does not cause corrosion.

The photoresist stripping composition of the invention essentially consists of about 5–20% by weight of a surfactant consisting essentially of a linear monoalkylbenzene sulfonic acid, about 1–10% by weight of dialkylbenzene sulfonic acid, about 5–20% of an alkyl phenol and about 40–80% by weight of a solvent comprising a mono—or dialkyl naphthalene wherein the alkyl group contains 1–4 carbon atoms.

A preferred composition of the invention consists of about 60–75% by weight of a mixture of mono—and dimethylnaphthalenes, about 8–15% by weight of nonylphenol, about 12–18% by weight of dodecylbenzene sulfonic acid and about 3–6% by weight of xylenesulfonic acid.

The solvents which can be utilized in the present invention are the alkyl naphthalenes of the formula:

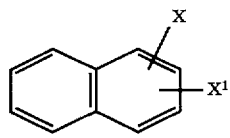

II wherein X is an alkyl group of 1 to 6 carbon atoms, and $X^1$ is selected from the group consisting of hydrogen and alkyl of 1 to 6 carbon atoms.

Suitable alkyl naphthalenes include monomethylnaphthalene, dimethylnaphthalene (for example 1,3-dimethylnaphthalene, 1,4-dimethylnaphthalene), diethylnaphthalene, methyl, ethylnaphthalene and mixtures thereof.

The alkyl phenols which can be used in the present invention and which provide a corrosion inhibiting effect are of the general formula:

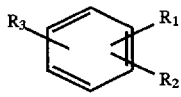

I wherein $R_1$, $R_2$ and $R_3$ are each selected from the group consisting of hydrogen and an alkyl group of 1–9 carbon atoms with the proviso that at least one of $R_1$, $R_2$ and $R_3$ is alkyl.

Suitable alkyl phenols which may be utilized in the invention include t-butyl phenol, octyl phenol, nonyl phenol, 2,4-dimethyl phenol, 2,4-diethyl phenol, and the like. Preferable are the alkyl phenols which not only provide a corrosion inhibitory effect but are surfactants, such as nonyl phenol.

Suitable surfactant type linear alkylbenzene sulfonic acids which may be used include linear octyl-, decyl- and dodecylbenzenesulfonic acid.

Suitable dialkylbenzenesulfonic acids are those containing two alkyl groups each, preferably linear, and composed of 1 to 4 carbon atoms and include the isomers of xylenesulfonic acid and the isomers of methylethylbenzene sulfonic acid. Preferred are the isomers of xylenesulfonic acid either individually or in admixture.

The polymeric organic substances which are to be removed by the stripping solutions of the invention are photoresists which generally comprise polymers selected from relatively low molecular weight polyisoprenes, polyvinyl cinnamates and phenol formaldehyde resins. These photoresists are applied to a substrate, e.g., $SiO_2$, silicon or aluminum and portions are masked. The masked substrate is then exposed to light, e.g., a 120 volt 650 watt quartz lamp for 1–15 seconds at a distance of 6–12 inches to harden the exposed photoresist. The portion of the photoresist which is not exposed is removed by solvent development, thus leaving a pattern, e.g., a portion of an electrical circuit pattern, on the exposed substrate. The remaining photoresist is then baked for further hardening and the portion of the substrate which is not covered by the photoresist is etched or otherwise treated. The etchant may be a buffered oxide, acid or plasma etchant which may further harden the photoresist. The hardened photoresist must then be removed before the substrate can be further processed or used. In employing the stripping solutions of this invention, the substrate covered with the baked photoresist is contacted with the stripping solution at a temperature of from about 25° C. to about 95° C., preferably between 50° and 70° C. The period required for stripping the photoresist vary to quite an extent, depending on the specific polymer used in the photoresist and photoresist processing conditions. Generally, the time involved will be between 1 and 10 minutes, although some resists, depending upon the bake temperature, may require 15 minutes, 30 minutes or longer before the polymeric photoresist is loosened from the substrate. It should be appreciated that many photoresists are completely dissolved off the substrate while others may be loosened, then floated off, and then dissolved in the stripping composition.

After the photoresist has been stripped from the substrate, the substrate is rinsed in any aqueous rinsing liquid. A solvent rinse may follow the stripping step, with solvents such as isopropanol, butylcellosolve or methylcellosolve being used. Since, however, the present compositions are substantially and cleanly water rinseable, it is acceptable to rinse with deionized water of the purity commonly found in semiconductor processing directly after stripping.

The stripping compositions of this invention are effective in stripping a wide and varied range of paints, enamels, lacquers, varnish, urethane coatings, powder and photoresist coatings and the like from various substrates such as wood or metal. As examples of wood or metal coatings that are stripped with the stripping compositions of this invention there may be mentioned, for examples, the following type coatings: linseed oil modified polyurethanes, white shellac, nitrocellulose coconut oil alkyds, acrylic modified alkyds, vinyl acetate/styrene/acrylic resins, tall oil-soya alkyds, soya-tung oil polyurethanes, tall oil linseed alkyds, epoxy paint, modified epoxy-ester resin paints, oil based enamels, alkyd enamels, marine varnishes, marine semi-gloss oil bases, latex enamels, lacquers, vinyl/acrylic resins, acrylic latexes, acrylic resins, phenolic resins and novolac/resole resins. The stripping compositions are also especially useful for stripping multiple layers of auto, airplane and metal enamels from metal substrates and are able to do so in a shorter time period and at a lower temperature than those previously used in commercial stripping compositions and methods.

The stripping compositions of this invention are especially useful and advantageous for numerous reasons among which may be mentioned the following. The stripping compositions are water rinseable, non-corrosive, and of low toxicity to humans and the environment. The stripping compositions may be recycled for multiple use or easily disposed of in an environmentally safe manner without the necessity for burdensome safety precautions. The stripping compositions of this invention evidence higher stripping efficiency at lower temperatures for a wide variety of coatings and substrates. Moreover, the stripping compositions are easily prepared by simply mixing the components at room temperature and thus require no special human or environmental safety precautions. Furthermore, the components of the stripping compositions of this invention provide synergistic stripping action and permit readily and substantially complete removal of coatings from substrates.

The effectiveness and unexpected nature of the stripping compositions of this invention is illustrated, but not limited, by the data presented in the following example.

EXAMPLE 1

A single coat of semi-gloss oil based enamel (white) from Cook and Dunn Paint Corporation, Newark, N.J., was brushed onto test sample of birch wood at a temperature of about 21°–25° C. and permitted to cure/dry for a period of four weeks at this temperature. The wood test sample all evidenced good water absorption properties prior to painting. Following the cure/dry steps, the test samples were subjected to stripping by brushing equivalent amounts of various stripping compositions on the painted substrates and resting the samples set for a specified period of time without disturbance. A soft cloth rag was then wetted with the stripping compositions and an attempt at finish removal was made by rubbing the test sample with the wetted rag.

Stripping compositions consisting solely of m-diisopropylebenezene or dodecylbenzene sulfonic acid, individually, each removed less than 50% of semi-gloss oil based enamel coating following a residence time of stripping compositions on the painted test samples of at least 8 minutes. In contradistinction, a stripping composition of this invention, consisting of 70% by weight of aromatic 200 N.D. (a naphthalene depleted solvent consisting of a mixture of mono- and dimethylnaphthalenes), 16% by weight of dodecylbenzenesulfonic acid, 4% by weight of xylenesulfonic acid and 10% by weight of nonylphenol removed 100% of the semi-gloss oil based enamel coating after a residence time of 5 minutes.

EXAMPLE 2

In order to demonstrate the efficiency of the different solvent compositions as negative photoresist strippers, the following tests were performed.

Metal substrates containing commercial negative photoresists were post-baked. The substrates were cooled and dipped into a vessel containing a stripping composition of the present invention maintained at 65° C. and stirred with a magnetic stirrer. The substrate was removed and dipped into a vessel containing isopropyl alcohol maintained at room temperature for 1 minute and then rinsed with deionized water.

The results were as follows:

| Test No. | Stripping Compositions % | Negative Photoresist | Post Bake/ 60 min. °C. | Stripping Results; % wafer cleared |
|---|---|---|---|---|
| A | nonyl phenol aromatic 200 ND (25/75) | KTI-747* SC-100** KTI-747 SC-100 | none none 150 150 | 0 0 0 0 |
| B | dodecylbenzene sulfonic acid | KTI-747 SC-100 KTI-747 SC-100 | none none 150 150 | <50% <50% <50% <50% |
| C | dodecylbenzene sulfonic acid 16%, xylene sulfonic acid 4%, nonyl phenol 10% aromatic, 200 ND 70% | KTI-747 SC-100 KTI-747 SC-100 | none none 150 150 | 100% 100% 100% 100% |

*Polyisoprene type negative resist from Eastman Kodak Co.
**negative resist from Olin-Hunt

EXAMPLE 3

The operating parameters of various stripping compositions were obtained either from product literature or independent test with the following results:

| Sample I | m-Diisopropylbenzene | 75% |
|---|---|---|
| | Dodecylbenzene sulfonic acid | 25% |
| Sample II | Composition sold by Indust-Ri-Chem Laboratory Inc. under the trade name J-100 | 50% |
| | Chlorinated aliphatic and aromatic hydrocarbons | |
| | Phenol | 10% |
| | Benzene sulfonic acid | 40% |
| Sample III | Composition sold by EKC Technology Inc. under the trade name Burmar Nophenol 922 | <75 |
| | $C_9$–$C_{12}$ Paraffins, cycloparafins, aromatics | |
| | Catechol | <5 |
| | Dodecylbenzensulfonic acid | <40 |
| Sample IV | Composition of the invention aromatic 200 ND | 70% |
| | Nonyl phenol | 10% |
| | Dodecylbenzene sulfonic acid | 16% |
| | Xylene sulfonic acid | 4% |

| Sample | I | II | III | IV |
|---|---|---|---|---|
| Resist Type | Neg | Pos–Neg | Pos–Neg | Neg |
| Recommended Operating Temp (°C.) | 25–85 | 90–100 | 95–105 | 25–95 |
| Composition Stability on Heating | Stable | Rapid Change | Rapid Change | Stable |
| Water Rinseability | Cleanly Rinseable | Not Recommended | Rinseable High | Cleanly Rinseable |
| Toxicity | Low | High | Degrades | Low |
| Performance Change on Prolonged Heating | Stable | Degrades | | Stable |
| Reactivity to Metals (Al Etch Rates) | 25 A/min (80° C.) (Strip) | 20 A/min (100° C.) (Strip) | 25–30 A/min (95°) (Strip) | 0–5 A/min (80° C.) (Strip) |

While the use of the hereinbefore recited stripping compositions of this invention has been described in connection with certain specific coatings and substrates for purposes of illustration, it will be appreciated that the stripping compositions of this invention are suitable for other stripping uses which will be apparent to those skilled in the art and can be employed with a variety of coatings on a variety of substrates in a variety of environments and industries.

What is claimed is:

1. A non-aqueous naphthalene-free negative photoresist stripping composition consisting essentially of about 40 to 80% by weight of an aromatic hydrocarbon solvent of the formula:

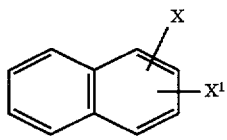

wherein X and $X_1$ are the same or different and each is a member selected from the group consisting of hydrogen and an alkyl group of 1 to 4 carbon atoms with at least one of X and $X^1$ being alkyl;

about 5 to 20% by weight of a surfactant consisting essentially of a linear monoalkylbenzene sulfonic acid;

about 1 to 10% by weight of a dialkylbenzenesulfonic acid wherein said alkyl groups contain 1 to 4 carbon atoms, and about 5 to 20% by weight of an alkyl phenol of the general formula:

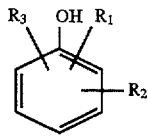

wherein $R_1$, $R_2$, and $R_3$ are each selected from the group consisting of hydrogen and an alkyl group of 1 to 9 carbon atoms wherein at least one of $R_1$, $R_2$ and $R_3$ is alkyl, and whereby said alkyl phenol provides a corrosion inhibitory effect.

2. The stripping composition of claim 1 wherein said surfactant is dodecylbenzene sulfonic acid.

3. The stripping composition of claim 1 wherein said alkyl phenol is nonyl phenol.

4. The stripping composition of claim 1 wherein said solvent is selected from the group consisting of methylnaphthalene, dimethylnaphthalene and mixtures thereof.

5. A non-aqueous naphthalene-free photoresist stripping composition consisting essentially of about 60 to 75% by weight of a solvent consisting of methylnaphthalene, dimethylnaphthalene and mixtures thereof, about 8 to 15% by weight of nonylphenol, about 12 to 18% by weight of dodecylbenzene sulfonic acid and about 3 to 6% by weight of xylenesulfonic acid.

* * * * *